(12) United States Patent
Augustino et al.

(10) Patent No.: US 8,171,877 B2
(45) Date of Patent: May 8, 2012

(54) BACKSIDE MOUNTED ELECTRODE CARRIERS AND ASSEMBLIES INCORPORATING THE SAME

(75) Inventors: Jason Augustino, Fremont, CA (US); Armen Avoyan, Glendale, CA (US); Yan Fang, Fremont, CA (US); Duane Outka, Fremont, CA (US); Hong Shih, Walnut, CA (US); Stephen Whitten, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 982 days.

(21) Appl. No.: 12/164,285

(22) Filed: Jun. 30, 2008

(65) Prior Publication Data

US 2009/0322199 A1 Dec. 31, 2009
US 2012/0013242 A9 Jan. 19, 2012

Related U.S. Application Data

(63) Continuation-in-part of application No. 12/073,651, filed on Mar. 7, 2008, now Pat. No. 7,767,028.

(60) Provisional application No. 60/906,808, filed on Mar. 14, 2007.

(51) Int. Cl.
| | |
|---|---|
| *B05C 13/00* | (2006.01) |
| *B05C 13/02* | (2006.01) |
| *B05C 21/00* | (2006.01) |
| *C23C 16/00* | (2006.01) |
| *C23C 16/50* | (2006.01) |
| *C23F 1/00* | (2006.01) |
| *H01L 21/306* | (2006.01) |

(52) U.S. Cl. ............... 118/503; 118/723 E; 118/723 R; 118/715; 118/500; 156/345.1; 156/345.34
(58) Field of Classification Search ................. None
See application file for complete search history.

(56) References Cited

U.S. PATENT DOCUMENTS 6,073,577 A 6/2000 Lilleland et al.
(Continued)

FOREIGN PATENT DOCUMENTS

JP 7066180 A 3/1995

OTHER PUBLICATIONS

International Search Report and Written Opinion dated Feb. 24, 2010 pertaining to International application No. PCT/US2009/048794.

*Primary Examiner* — Dah-Wei Yuan
*Assistant Examiner* — Binu Thomas
(74) *Attorney, Agent, or Firm* — Dinsmore & Shohl LLP (57) ABSTRACT

A carrier assembly is provided comprising a backside mounted electrode carrier and electrode mounting hardware. The backside mounted electrode carrier comprises an electrode accommodating aperture, which in turn comprises a sidewall structure that is configured to limit lateral movement of an electrode positioned in the aperture. The electrode accommodating aperture further comprises one or more sidewall projections that support the weight of an electrode positioned in the aperture. The electrode mounting hardware is configured to engage an electrode positioned in the electrode accommodating aperture from the backside of the carrier and urge the electrode against the sidewall projections so as to limit axial movement of the electrode in the electrode accommodating aperture. Additional embodiments of broader and narrower scope are contemplated.

20 Claims, 7 Drawing Sheets

U.S. PATENT DOCUMENTS

| | | | |
|---|---|---|---|
| 6,148,765 A | 11/2000 | Lilleland et al. | |
| 6,194,322 B1 | 2/2001 | Lilleland et al. | |
| 6,237,528 B1 * | 5/2001 | Szapucki et al. | 118/723 E |
| 6,245,192 B1 | 6/2001 | Dhindsa et al. | |
| 6,258,228 B1 | 7/2001 | Reiss | |
| 6,376,385 B2 | 4/2002 | Lilleland et al. | |
| 6,506,254 B1 | 1/2003 | Bosch et al. | |
| 2005/0241765 A1 | 11/2005 | Dhindsa et al. | |
| 2006/0138081 A1 | 6/2006 | Huang et al. | |
| 2006/0141787 A1 | 6/2006 | Ren et al. | |
| 2006/0141802 A1 | 6/2006 | Shih et al. | |
| 2007/0068629 A1 | 3/2007 | Shih et al. | |
| 2007/0235660 A1 | 10/2007 | Hudson | |
| 2007/0284246 A1 | 12/2007 | Keil et al. | |
| 2008/0015132 A1 * | 1/2008 | Ren et al. | 510/175 |
| 2008/0092920 A1 * | 4/2008 | Shih et al. | 134/1 |
| 2008/0223401 A1 * | 9/2008 | Augustino et al. | 134/3 |
| 2008/0236618 A1 | 10/2008 | Outka et al. | |
| 2008/0236620 A1 | 10/2008 | Shih et al. | |
| 2009/0321018 A1 * | 12/2009 | Augustino et al. | 156/345.43 |
| 2009/0325320 A1 * | 12/2009 | Avoyan et al. | 438/4 |
| 2010/0108093 A1 | 5/2010 | Peng et al. | |
| 2010/0139692 A1 | 6/2010 | Avoyan et al. | |

* cited by examiner

BACKSIDE MOUNTED ELECTRODE CARRIERS AND ASSEMBLIES INCORPORATING THE SAME

CROSS-REFERENCE TO RELATED APPLICATIONS

This application is a continuation-in-part of U.S. application Ser. No. 12/073,651, filed Mar. 7, 2008, now U.S. Pat. No. 7,767,028, issued Aug. 3, 2010, which claims priority to U.S. Provisional Application No. 60/906,808, filed Mar. 14, 2007.

SUMMARY

The present disclosure relates generally to an electrode carrier for use in handling and processing electrodes and, more particularly, to a backside mounted carrier for multi-component electrodes that are used as excitation electrodes in plasma processing systems. Although the present disclosure is not limited to particular types of electrodes or the context in which the electrodes to be carried have been used, for the purposes of illustration, the carrier is illustrated herein with reference to silicon-based electrode assemblies where an "inner," disc-shaped, showerhead silicon electrode is bonded to a backing plate. Those practicing the present invention will find that some of the carrier designs proposed herein will enjoy favorable utility in the context of a variety of types of electrodes and non-electrodes.

Figure 1:
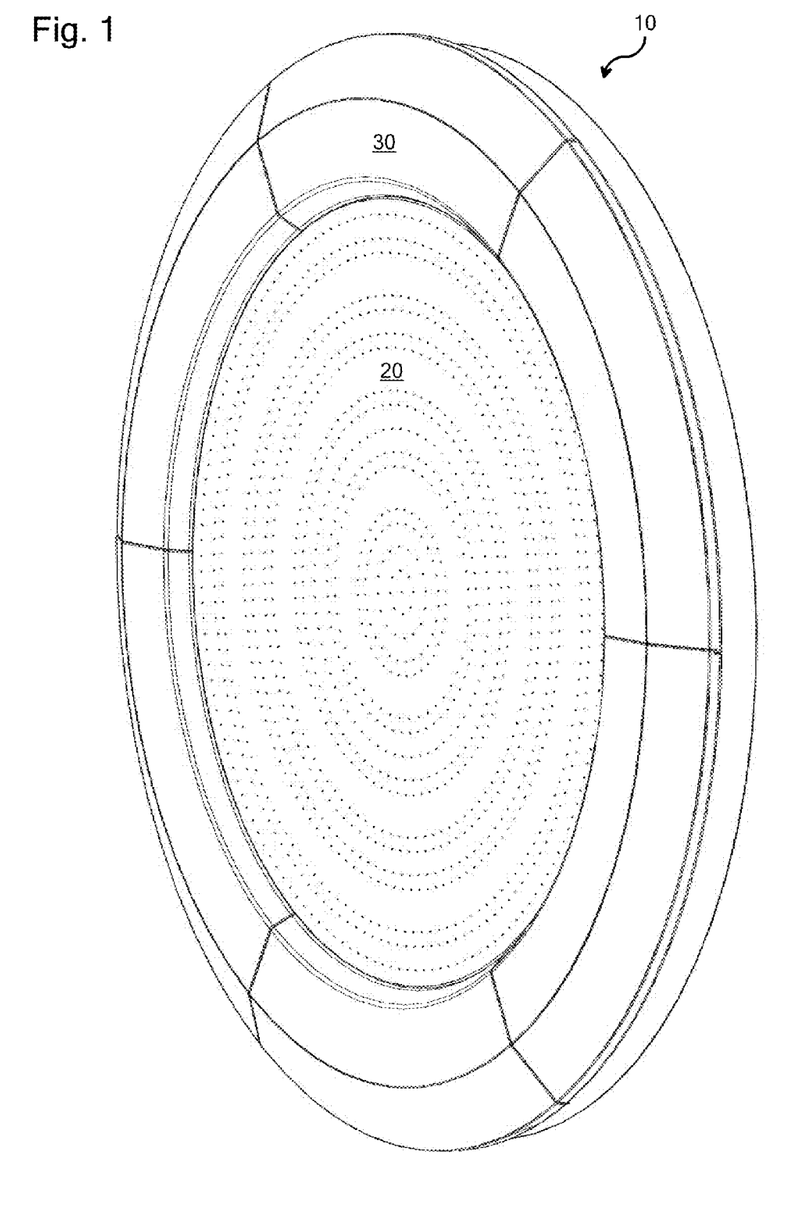
FIG. 1 illustrates an electrode assembly comprising an inner showerhead electrode and an outer ring-shaped electrode.
Figure 2:
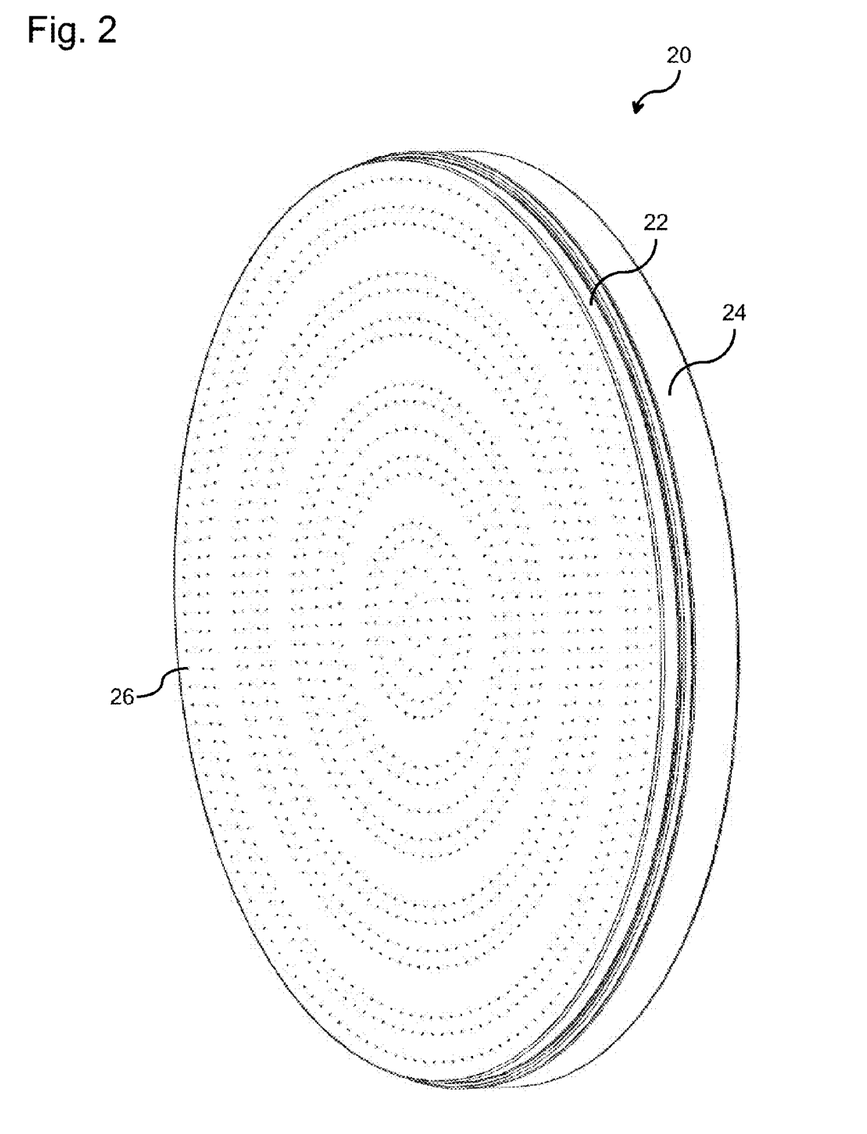
FIG. 2 illustrates the inner electrode of FIG. 1 in isolation.
Figure 3:
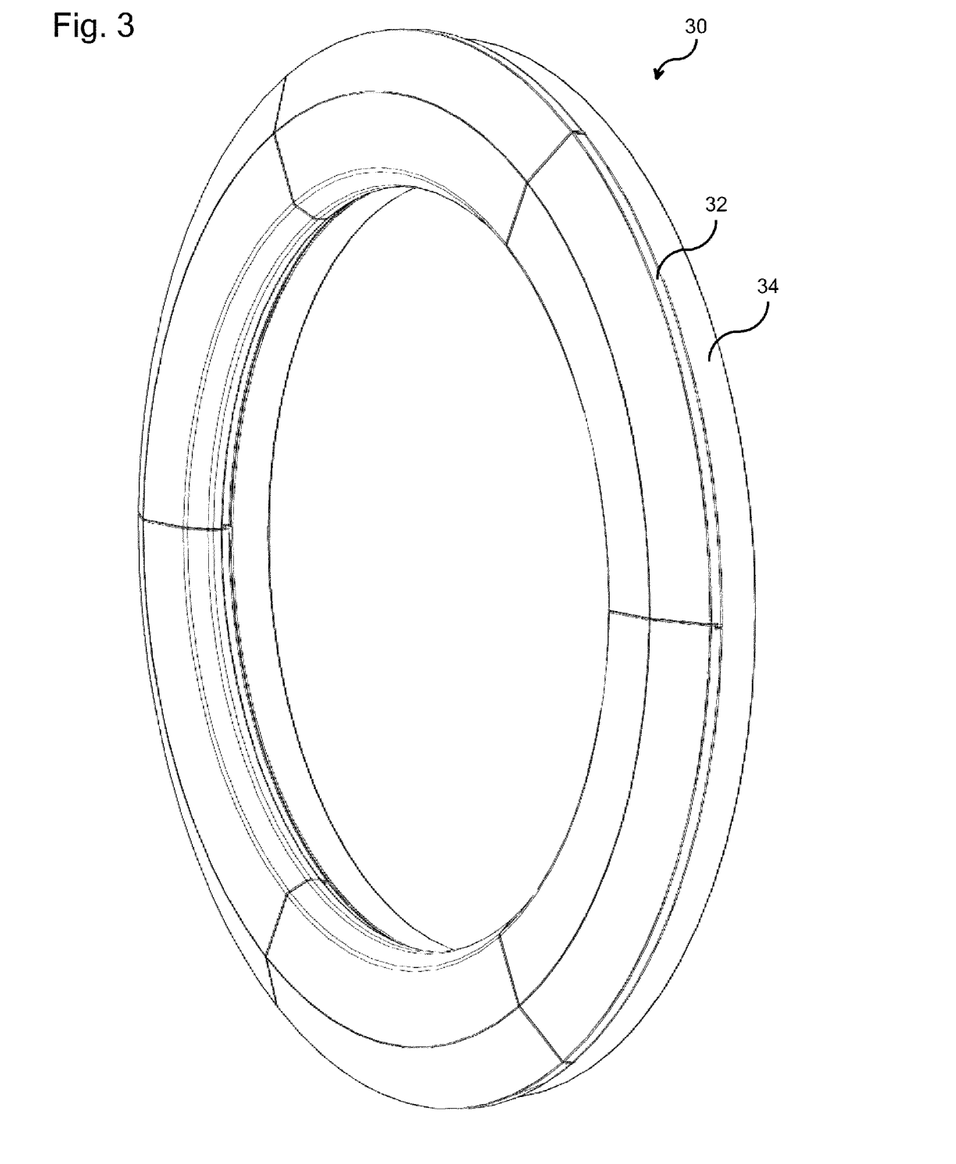
FIG. 3 illustrates the outer electrode of FIG. 1 in isolation.

FIG. 1 illustrates an electrode assembly 10 comprising an inner showerhead electrode 20 and an outer ring-shaped electrode 30. FIG. 2 illustrates the inner multi-component electrode 20 in isolation. FIG. 3 illustrates the outer multi-component electrode 30 in isolation. Generally, the electrode assembly 10 is formed from two types of multi-component electrodes—a disc-shaped, inner multi-component showerhead electrode 20 and a ring-shaped, outer multi-component electrode 30. Both of these multi-component electrodes 20, 30 comprise a silicon electrode 22, 32 bonded to an electrically conductive backing plate 24, 34. The inner electrode illustrated in FIG. 1 and comprises an array of gas passages 26 commonly referred to in the art as showerhead passages. The outer electrode 30 comprises a series of peripheral silicon segments pieced together to surround the periphery of the inner electrode 20. Other particular features of the electrodes 20, 30 and the electrode assembly 10 are beyond the focus of the present disclosure and, as such, are not described in detail herein. Further teachings regarding the structure of electrode assemblies similar to that illustrated in FIGS. 1-3 can be found in US Pub. Nos. 2007/0068629, 2007/0235660, and 2007/0284246, pertinent portions of which are incorporated herein by reference. Additional related teachings can be found in U.S. Pat. Nos. 6,073,577, 6,148,765, 6,194,322, 6,245,192, 6,376,385, and 6,506,254, and US Pub. No. 2005/0241765.

In accordance with one embodiment, a carrier assembly is provided comprising a backside mounted electrode carrier and electrode mounting hardware. The backside mounted electrode carrier comprises an electrode accommodating aperture, which in turn comprises a sidewall structure that is configured to limit lateral movement of an electrode positioned in the aperture. The electrode accommodating aperture further comprises one or more sidewall projections that support the weight of an electrode positioned in the aperture. The electrode mounting hardware is configured to engage an electrode positioned in the electrode accommodating aperture from the backside of the carrier and urge the electrode against the sidewall projections so as to limit axial movement of the electrode in the electrode accommodating aperture.

In another embodiment, a backside mounted electrode carrier is provided where the backside of the electrode carrier comprises a plurality of receiving slots, each of which is configured to secure a corresponding end portion of a bracing leg of a carrier brace. Each of the receiving slots define respective twist-lock pathways allowing the carrier brace to secure an electrode in the electrode accommodating aperture of the carrier. Additional embodiments of broader and narrower scope are contemplated.

BRIEF DESCRIPTION OF THE SEVERAL VIEWS OF THE DRAWINGS

The following detailed description of specific embodiments can be best understood when read in conjunction with the following drawings, where like structure is indicated with like reference numerals and in which.

DETAILED DESCRIPTION

As is noted above, the present disclosure relates to a backside mounted carrier for multi-component electrodes. The concepts of the present disclosure should not be limited to particular electrode or electrode assembly configurations. For example, the multi-component, inner and outer electrodes 20, 30 illustrated in FIGS. 1-3 may comprise any of a variety of backing plate configurations including, but not limited to, electrically conductive aluminum-based or graphite-based backing plates 24, 34. In addition, the silicon electrodes 22, 32 may be bonded to the corresponding electrically conductive backing plate 24, 34 in any of a variety of manners. Typically, a polymeric adhesive is applied at the interface between the electrode and backing plate and mechanical means are used to secure the bond. It is also contemplated that a non-adhesive gasket may be used at the interface and the electrode and backing plate may be bonded mechanically. With regard to the silicon electrodes 22, 32, it is noted that reference herein to a silicon electrode or an electrode comprising silicon should be read to cover any of a variety of electrodes that utilize any of a variety of forms of silicon in their construction.

Figures 4A, 4B:
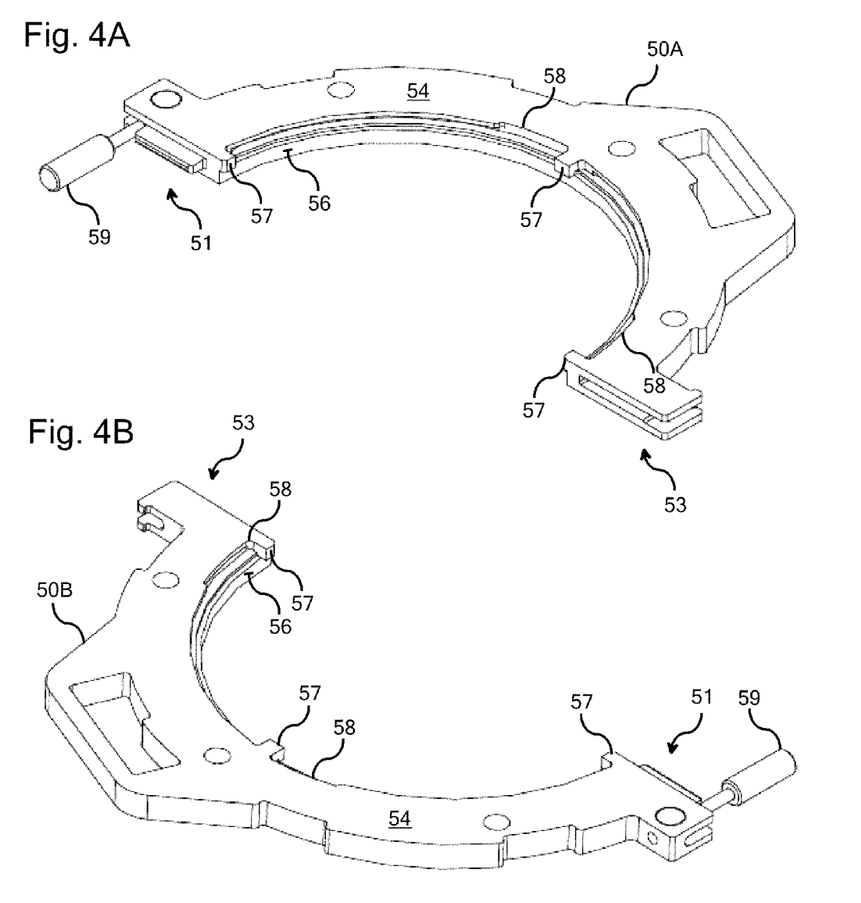
FIGS. 4A and 4B illustrate the two primary component parts of a backside mounted electrode carrier.
Figure 5:
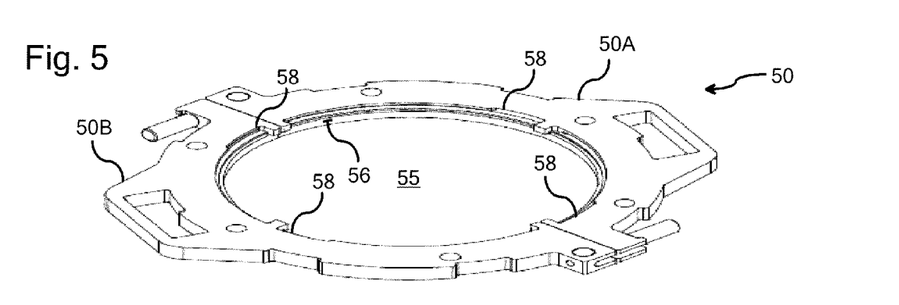
FIG. 5 illustrates the assembled components of FIGS. 4A and 4B.

Although the particular features of the backside mounted electrode carrier illustrated herein may vary, one particular configuration according to the present disclosure is illustrated herein with reference to FIGS. 4-10. More specifically, FIGS. 4A and 4B illustrate the two primary component halves 50A, 50B of a backside mounted electrode carrier 50 according to one embodiment of the present disclosure. FIG. 5 illustrates the assembled components of FIGS. 4A and 4B. Generally, as is further illustrated in FIGS. 5-8, the electrode carrier 50 comprises a frontside 52, a backside 54, and an electrode accommodating aperture 55.

The electrode accommodating aperture 55 comprises a sidewall structure 56 that is configured to limit lateral movement of an electrode 20 positioned in the electrode accommodating aperture 55. For the purposes of describing and defining the present invention, it is noted that "lateral" movement comprises movement in the plane of the carrier 50, as opposed to "axial" movement which comprises movement along an axis extending through the aperture 55, parallel to the plane of the carrier 50.

Figure 6:
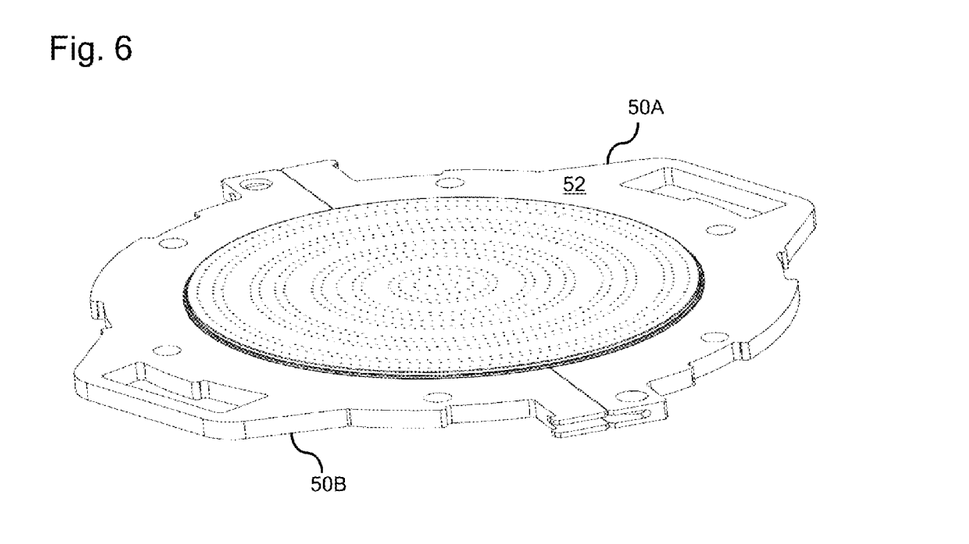
FIG. 6 illustrates a multi-component electrode held in the assembled components of the backside mounted electrode carrier illustrated in FIG. 5.
Figure 7:
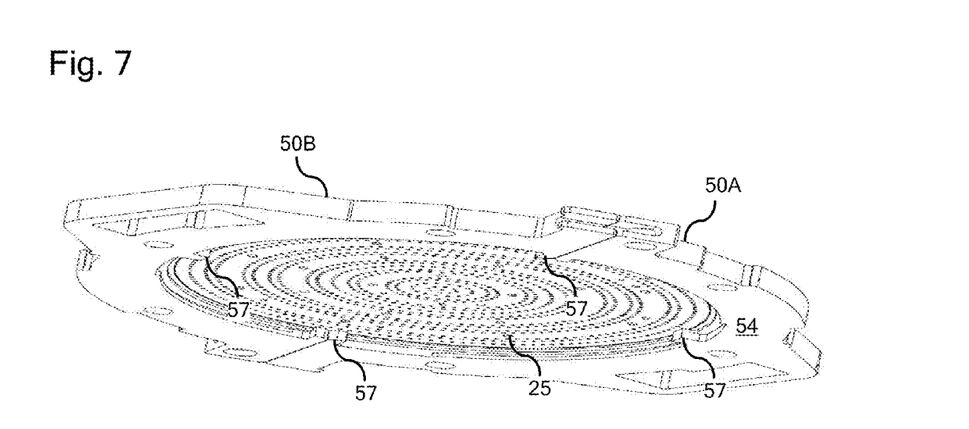
FIG. 7 illustrates the backside of the assembled carrier of FIG. 6.

The electrode accommodating aperture further comprises one or more sidewall projections 57 that are configured to support the weight of the electrode 20 as it rests upon the sidewall projections 57. FIGS. 6 and 7 show the electrode 20 resting on the sidewall projections 57. In the illustrated embodiment, the sidewall projections 57 comprise relatively discrete tabs but it is contemplated that the sidewall projections 57 may take a variety of forms and may be provided in a variety of numbers along the sidewall structure 56. For example, at one extreme a single, continuous sidewall projection may be provided along the entire inner periphery of the sidewall structure 56 as a circumferential ledge.

As is illustrated in FIGS. 4A and 4B, the electrode accommodating aperture 55 of the illustrated embodiment comprises a split aperture configuration including two primary component halves 50A, 50B engaged via a pair of tongue-in-groove interfaces 51, 53. Each of the component halves can be secured to each other at the interfaces 51, 53 with suitable engaging hardware, such as a pair of threaded PEEK inserts 59. It is contemplated, however that the electrode carrier does not necessarily have to be presented in two component halves, as long as the electrode 20 can be conveniently placed in the electrode-accommodating aperture 55. It is also contemplated that the electrode 20 can be positioned in the electrode-accommodating aperture 55 or the two component halves 50A, 50B of the carrier 50 can be positioned about the electrode 20 with the aid of a carrier installation stand configured to allow the electrode to sit on a controlled clean surface at the proper height to allow the carrier to be placed around the electrode. The carrier would also be placed on a controlled, clean surface.

Figure 8:
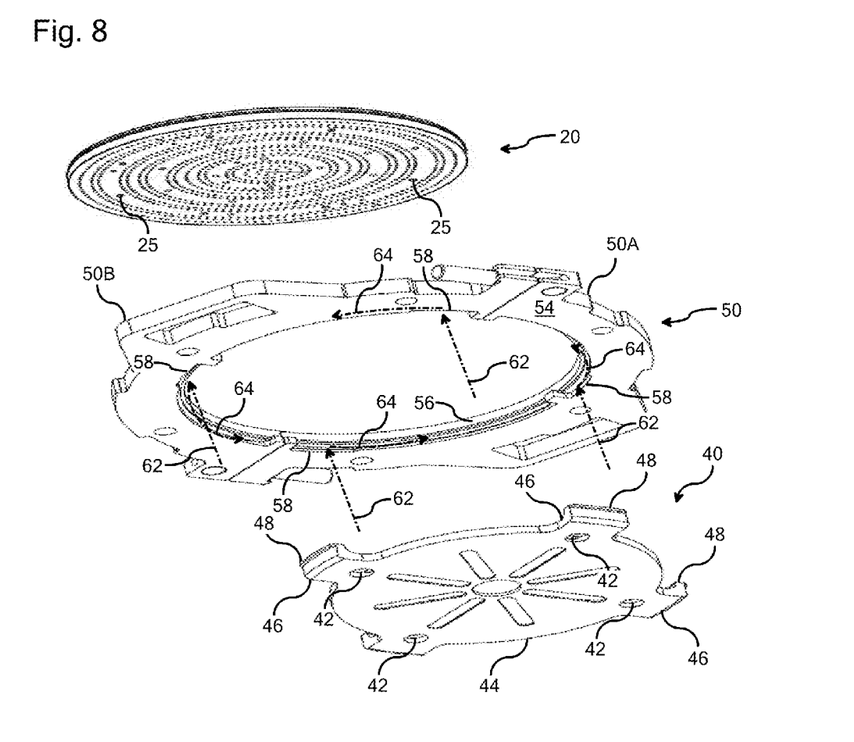
FIG. 8 is a partially exploded view of the assembled carrier of FIG. 6, including a backside mounting plate.

FIG. 8 is a partially exploded view of an assembly comprising the inner showerhead electrode 20, the backside mounted electrode carrier 50, and electrode mounting hardware 40. As will be described in further detail herein, the electrode mounting hardware 40 is configured to engage the electrode 20 from the backside 54 of the carrier 50 and urge the electrode 20 against the sidewall projections 57 so as to limit axial movement of the electrode 20 in the electrode accommodating aperture 55.

Figure 9:
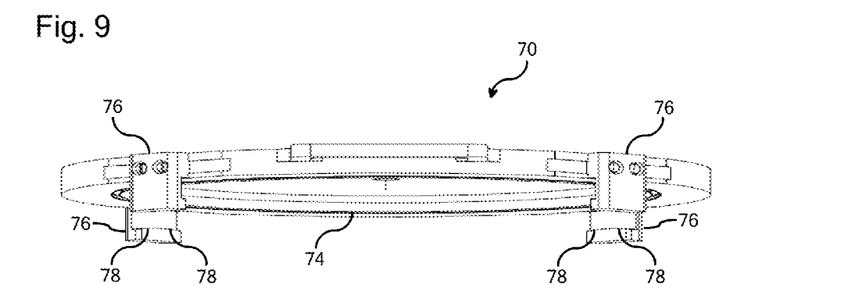
FIG. 9 is an isometric illustration of a purge plate for use with the assembled carrier of FIG. 6.

Referring collectively to FIGS. 7 and 8, the electrode mounting hardware 40 comprises electrode engaging extensions 42 and a carrier brace 44. The electrode engaging extensions 42 may, for example, comprise threaded PEEK screws or other types of inserts that are configured to engage corresponding threaded or non-threaded bores 25 in the rear face 28 of the electrode 20 and, in cooperation with the carrier brace 44, which is configured to engage the backside 54 of the carrier 50, urge the rear face 28 of the electrode 20 against the sidewall projections 57 of the carrier 50. The mounting hardware 40 will simultaneously urge the carrier brace 44 against the backside 54 of the electrode carrier 50 to effectively secure the electrode 20 in the electrode accommodating aperture 55. Because of the relatively short length of the electrode engaging extensions 42, only the head portions thereof are illustrated in FIG. 8. FIG. 9, which is discussed in further detail below, also illustrates the manner in which the electrode engaging extensions 42 engage the bores 25 in the rear face 28 of the electrode 20.

Although the embodiment illustrated in FIGS. 7 and 8 comprises a carrier brace 44 that is configured as a relatively elaborate spider plate comprising a plurality of bracing legs 46, it is contemplated that the electrode mounting hardware 40 may be provided in a variety of forms, which may or may not include electrode engaging extensions 42 or a carrier brace 44. In practicing this aspect of the present disclosure all that is required is some type of hardware that engages the electrode 20 from the backside 54 of the carrier 50 to urge the electrode 20 against one or more sidewall projections 57 to limit axial movement of the electrode 20 in the carrier 50. The engagement with the electrode 20 should be non-permanent and may be by mechanical, chemical, magnetic, or any other suitable means.

In one embodiment, the backside 54 of the electrode carrier 50 comprises a plurality of receiving slots 58, each of which is configured to secure a corresponding end portion 48 of one of the bracing legs 46. As is illustrated in FIGS. 8 and 10, the receiving slots 58 and the end portions 48 of the bracing legs 46 define a twist-lock configuration where the end portions 48 of the bracing legs 46 are inserted into the receiving slots 58 along an axial component 62 of a twist-lock pathway and, once in the receiving slots 58, are rotated to a secure position along a rotational component 64 of the twist-lock pathway.

The precise location of the secure position along the rotational component 64 of the twist-lock pathway is established by rotating the carrier brace 44 to align the aforementioned electrode engaging extensions 42 with the corresponding bores 25 in the electrode 20. The electrode mounting hardware 40 may comprise a plurality of electrode engaging extensions 42 and, to permit convenient alignment, the rear face 28 of the electrode 20 may comprise an array of bores 25 configured to receive the electrode engaging extensions 42 in a plurality of different orientations.

Figure 10:
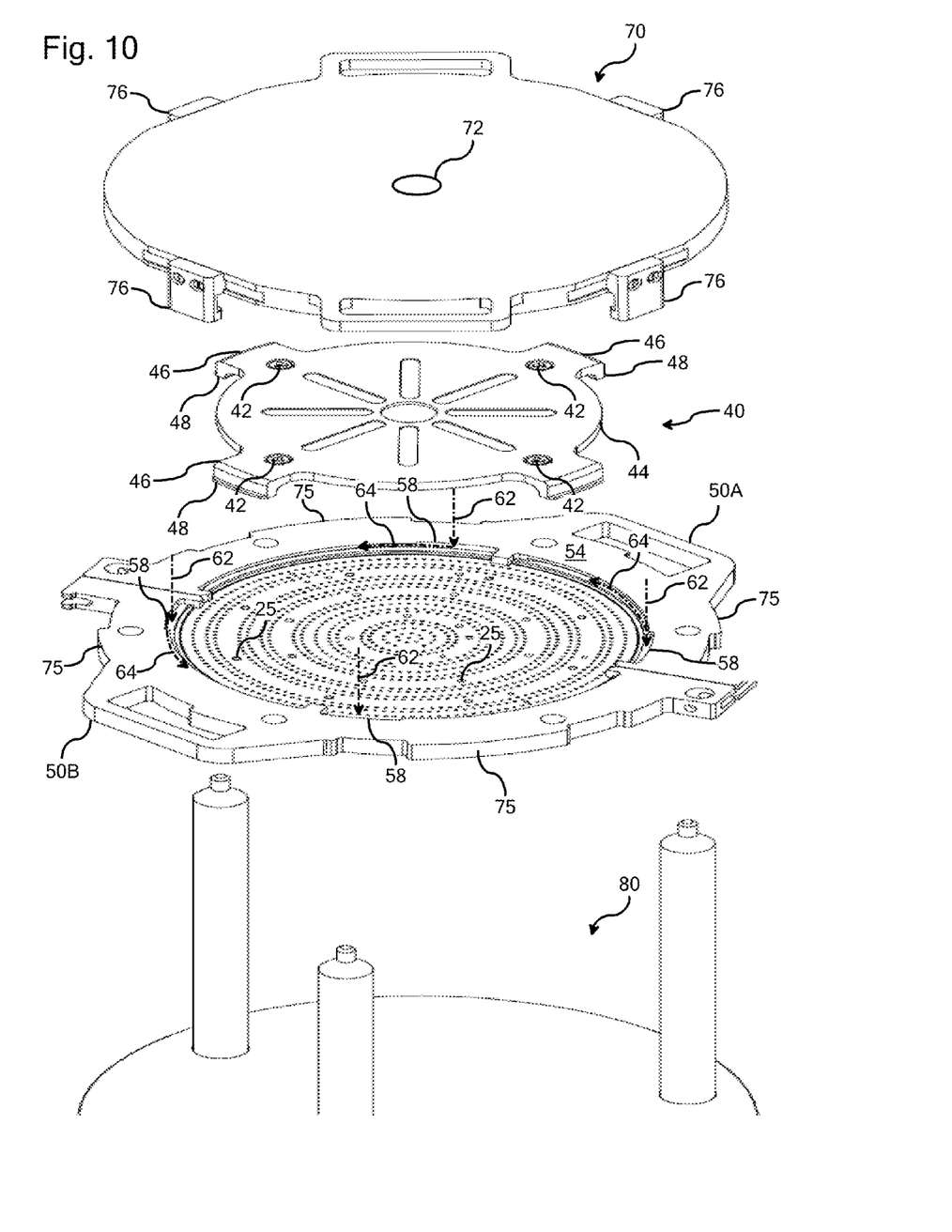
FIG. 10 is a partially exploded view of the assembled carrier of FIG. 6 and an associated purge plate and tripod stand for use with the carrier.

Referring now to FIGS. 9 and 10, in another embodiment, the assembly further comprises a purge plate 70 comprising a purge gas input port 72 and a backside seal 74 that interfaces with the backside 54 of the electrode carrier 50 to form a sealed purge gas chamber along the rear face 28 of the electrode 20. A suitable purge gas, like nitrogen or clean dry air, can be presented to the sealed purge gas chamber at relatively high pressure to purge the gas passages 26 of the electrode 20 before, during, or after other electrode reconditioning operations, the subject matter of which is beyond the scope of the present disclosure. For the purposes of describing and defining the present invention, it is noted that "reconditioning" operations generally refer to a variety of processes for treating a component and include, but are not limited to, chemical treatment, polishing, cleaning, etc.

The electrode carrier 50 can be provided with a plurality of purge plate flanges 75 to facilitate installation of the purge plate 70, which comprises a plurality of purge plate legs 76 that are configured to interface with the purge plate flanges 75. More specifically, the purge plate legs 76 comprise tapered flange engaging surfaces 78 that are configured to compress the backside seal 74 between the purge plate 70 and the backside 54 of the electrode carrier 50 upon engagement of the backside seal 74 with the backside 54 of the electrode carrier 50 and rotation of the purge plate 70 relative to the electrode carrier 50. In the illustrated embodiment the flange engaging surfaces 78 define a bi-directional taper to permit compression upon rotation of the purge plate 70 in the clockwise and counterclockwise directions.

Also illustrated in FIG. 10 is a tripod stand 80 that may be used to support the assembly during reconditioning operations. The tripod stand comprises at least three carrier supports that interface with the frontside 52 of the electrode carrier 50.

To reduce the possibility of contamination during reconditioning procedures, the various assembly components described herein can be fabricated using materials that are resistant to oxidation or other process-related degradation. For example, and not by way of limitation, the materials should be chemically resistant to isopropyl alcohol, sulfuric acid, hydrogen peroxide, hydrofluoric acid, nitric acid, acetic acid, and the like. Suitable materials include, but are not limited to, polymers such as polypropylene and polycarbonate for components like the carrier body and PEEK for components like the threaded inserts 59 and the electrode engaging extensions 42.

It is noted that recitations herein of a component of the present invention being "configured" to embody a particular property or function in a particular manner are structural recitations as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure. Similarly, although some aspects of the present disclosure are identified herein as preferred or particularly advantageous, it is contemplated that the present disclosure is not necessarily limited to these preferred aspects of the invention.

For the purposes of describing and defining the present disclosure it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims. For example, although the electrode carrier 50 illustrated in FIGS. 4 and 5 is configured as a relatively elaborate structure comprising a plurality of specialized features, it is contemplated that the carrier 50 may merely be presented as a relatively simple, ring-shaped structure including some type of electrode accommodating aperture and one or more sidewall projections for supporting an electrode.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. An assembly comprising a backside mounted electrode carrier and electrode mounting hardware, wherein:
   the backside mounted electrode carrier is formed by a material comprising a polymer;
   the backside mounted electrode carrier comprises a frontside, a backside, and an electrode accommodating aperture in the frontside of the carrier;
   the electrode accommodating aperture comprises a sidewall structure that is configured to limit lateral movement of an electrode positioned in the electrode accommodating aperture;
   the electrode accommodating aperture further comprises one or more sidewall projections configured to support the weight of an electrode positioned in the electrode accommodating aperture and resting upon the sidewall projections; and
   the electrode mounting hardware is configured to engage an electrode positioned in the electrode accommodating aperture from the backside of the carrier and urge the electrode against the sidewall projections so as to limit axial movement of the electrode in the electrode accommodating aperture.

2. An assembly as claimed in claim 1 wherein the electrode mounting hardware is configured to engage a rear face of an electrode positioned in the electrode accommodating aperture and urge the rear face of the electrode against the sidewall projections.

3. An assembly as claimed in claim 1 wherein:
   the electrode mounting hardware comprises an electrode engaging extension and a carrier brace;
   the electrode engaging extension is configured to engage a rear face of an electrode positioned in the electrode accommodating aperture;
   the carrier brace is configured to engage the backside of the carrier; and
   the mounting hardware is configured to urge the carrier brace against the backside of the electrode carrier and the rear face of the electrode against the sidewall projections simultaneously.

4. An assembly as claimed in claim 3 wherein the electrode engaging extension comprises a threaded insert and the rear face of the electrode comprises a threaded bore.

5. An assembly as claimed in claim 3 wherein the carrier brace is configured as a spider plate comprising a plurality of bracing legs.

6. An assembly as claimed in claim 5 wherein the backside of the electrode carrier comprises a plurality of receiving slots, each of which is configured to secure a corresponding end portion of one of the bracing legs.

7. An assembly as claimed in claim 6 wherein the receiving slots and the bracing legs define a twist-lock configuration.

8. An assembly as claimed in claim 1 wherein the electrode mounting hardware comprises a plurality of electrode engaging extensions and the rear face of the electrode comprises an array of bores configured to receive the electrode engaging extensions in a plurality of different orientations.

9. An assembly as claimed in claim 1 wherein:
   the electrode mounting hardware comprises a plurality of electrode engaging extensions and a carrier brace comprising a plurality of bracing legs;

the rear face of the electrode comprises corresponding bores configured to receive the electrode engaging extensions;

the backside of the electrode carrier comprises a plurality of receiving slots, each of which is configured to secure a corresponding end portion of one of the bracing legs; and the receiving slots and the end portions of the bracing legs are configured such that the electrode engaging extensions and the electrode bores can be aligned through rotation of the carrier brace relative to the electrode carrier.

10. An assembly as claimed in claim 1 wherein the backside electrode accommodating aperture comprises a split aperture configuration.

11. An assembly as claimed in claim 10 wherein component parts of the split aperture are engaged via a pair of tongue-in-groove interfaces on opposite sides of the aperture.

12. An assembly as claimed in claim 1 wherein:
the backside of the electrode carrier comprises a plurality of receiving slots, each of which is configured to secure a corresponding end portion of a bracing leg; and
the receiving slots define respective twist-lock pathways.

13. An assembly as claimed in claim 12 wherein the respective twist-lock pathways comprise an axial component and a rotational component.

14. An assembly as claimed in claim 1 wherein the assembly further comprises a purge plate comprising a backside seal that interfaces with the backside of the electrode carrier.

15. An assembly as claimed in claim 14 wherein:
the electrode carrier comprises a plurality of purge plate flanges; and
the purge plate further comprises a plurality of purge plate legs that are configured to interface with the purge plate flanges.

16. An assembly as claimed in claim 15 wherein the purge plate legs comprise tapered flange engaging surfaces configured to compress the backside seal between the purge plate and the backside of the electrode carrier upon rotation of the purge plate relative to the electrode carrier.

17. An assembly as claimed in claim 1 wherein the assembly further comprises a tripod stand comprising at least three carrier supports that interface with the frontside of the electrode carrier.

18. An assembly as claimed in claim 1 wherein:
the electrode comprises a multi-component electrode comprising silicon front face bonded to a non-silicon, electrically conductive backing plate; and
the electrode mounting hardware is configured to engage a rear face of the backing plate urge the rear face of the electrode against the sidewall projections so as to limit axial movement of the electrode in the electrode accommodating aperture.

19. A backside mounted electrode carrier comprising a frontside, a backside, and an electrode accommodating aperture in the frontside of the carrier, wherein:
the electrode accommodating aperture comprises a sidewall structure that is configured to limit lateral movement of an electrode positioned in the electrode accommodating aperture;
the electrode accommodating aperture further comprises one or more sidewall projections configured to support the weight of an electrode positioned in the electrode accommodating aperture and resting upon the sidewall projections;
the backside of the electrode carrier comprises a plurality of receiving slots, each of which is configured to secure a corresponding end portion of a bracing leg; and
the receiving slots define respective twist-lock pathways.

20. A backside mounted electrode carrier as claimed in claim 19 wherein the respective twist-lock pathways comprise an axial component and a rotational component.

* * * * *

UNITED STATES PATENT AND TRADEMARK OFFICE Certificate

Patent No. 8,171,877 B2                                                                                         Patented: May 8, 2012

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Jason Augustino, CA (US); Armen Avoyan, Glendale, CA (US); Yan Fang, Fremont, CA (US); Duane Outka, Fremont, CA (US); Hong Shih, Walnut, CA (US); Stephen Whitten, Danville, CA (US); and Charles Rising, Portland, OR (US).

Signed and Sealed this Twenty-first Day of May 2013.

DAH-WEI D. YUAN
*Supervisory Patent Examiner*
Art Unit 1717
Technology Center 1700